United States Patent
Barringer et al.

(10) Patent No.: US 7,258,574 B2
(45) Date of Patent: Aug. 21, 2007

(54) SNAP-FIT ELECTROMAGNETIC SHIELD

(75) Inventors: Dennis R. Barringer, Wallkill, NY (US); Shawn Canfield, Poughkeepsie, NY (US); David C. Linnell, Poughkeepsie, NY (US); Robert L. Nicoletti, Milton, NY (US); Harold M. Toffler, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 10/955,046

(22) Filed: Sep. 30, 2004

(65) Prior Publication Data

US 2006/0068639 A1    Mar. 30, 2006

(51) Int. Cl.
    *H01R 13/648* (2006.01)
(52) U.S. Cl. .................. 439/607; 439/939; 439/358; 174/35 R
(58) Field of Classification Search ............ 439/939, 439/357, 358, 374, 607; 174/35 R, 35 C; 361/800
See application file for complete search history.

(56) References Cited

U.S. PATENT DOCUMENTS

| | | | |
|---|---|---|---|
| 4,218,578 A | 8/1980 | Olschewski et al. | 174/35 R |
| 4,514,029 A | 4/1985 | Lax et al. | 339/143 R |
| 5,083,239 A | 1/1992 | Sedlemeier et al. | 361/424 |
| 5,112,251 A * | 5/1992 | Cesar | 439/607 |
| 5,256,086 A | 10/1993 | Ponn | 439/607 |
| 5,317,105 A * | 5/1994 | Weber | 174/35 GC |
| 5,508,889 A | 4/1996 | Ii | 361/816 |
| 5,652,410 A | 7/1997 | Hobbs et al. | 175/35 R |
| 5,766,041 A * | 6/1998 | Morin et al. | 439/609 |
| 6,005,186 A | 12/1999 | Bachman | 174/35 R |
| 6,202,294 B1 | 3/2001 | Bogannam | 29/764 |
| 6,206,731 B1 * | 3/2001 | Kuo | 439/610 |
| 6,339,536 B1 | 1/2002 | Buican et al. | 361/818 |
| 6,660,933 B2 | 12/2003 | Festag | 174/35 GC |
| 6,661,651 B1 | 12/2003 | Tanzer et al. | 361/685 |

\* cited by examiner

*Primary Examiner*—Xuong Chung-Trans
(74) *Attorney, Agent, or Firm*—Cantor Colburn LLP

(57) ABSTRACT

A snap-fit shield is provided which fits securely within a frame opening, and which shields and grounds the opening while eliminating a need for a complementary connector portion. The shield has an insulative inner housing having a first base wall and a first pair of side walls and end walls extending therefrom defining a first cavity. The shield includes a conductive shell having a second base wall and a second pair of side walls and end walls extending therefrom defining a second cavity. The second pair of side walls and end walls have at least one outward bias positioned thereon. The shield also has an insulative outer housing having a third base wall and a third pair of side walls and end walls extending therefrom defining a third cavity. The outer housing is configured to snap-fit within an opening in a frame so as to shield circuitry internal thereto. The third cavity of the outer housing is configured to receive at least a portion of the conductive shield therein, while the second cavity of the conductive shield is configured to receive the inner housing therein.

21 Claims, 3 Drawing Sheets

SNAP-FIT ELECTROMAGNETIC SHIELD

BACKGROUND OF INVENTION

The present invention relates generally to the shielding of electromagnetic radiation in order to minimize electromagnetic coupling, and to the prevention of electrostatic discharge. More specifically, the present invention provides improved shielding and grounding of the openings in shielded equipment cages, e.g., in computer equipment, telecommunications equipment, and the like.

Two problems that have long plagued electrical equipment designers are electromagnetic coupling (EMC) and electrostatic discharge (ESD). EMC is the unintentional transfer of electromagnetic radiation from one or more electrical components to another electrical component. EMC produces undesirable noise in and/or interferes with the normal operation of the receiving electrical component. EMC can occur any time an electrical component is located within an electromagnetic radiation rich environment, such as proximate other electrical components. To prevent EMC, a system of electrical components, e.g., the various interconnected circuit boards of a computer, is often contained within a metal cage, e.g., a processor cage, that blocks out, i.e., "shields" the system from most electromagnetic radiation existing outside the metal cage, and that likewise prevents electromagnetic radiation produced within the cage from affecting equipment external to the cage.

ESD is the discharge of static electrical charge that occurs when two objects having different static charge states, e.g., different amounts of charge, opposite polarity charge, etc., are closely proximate. Because ESD can result in large, although short duration, voltages which can interfere with the operation of or damage electrical devices, ESD must be avoided whenever possible. To prevent static charge buildup that can cause ESD, the cage, electrical components therewithin, and any connections thereto share the same ground, i.e., are commonly grounded. For instance, a computer may have a processor cage shielding the computer's main circuit boards, and a frame surrounding and supporting a hard drive, power supply, the processor cage, etc. To prevent ESD between the frame and processor cage, the frame and processor cage should be commonly grounded whenever a connection is made therebetween.

While a properly grounded cage may protect electrical circuitry within the cage from EMC and ESD, often the electrical circuitry within the cage must connect to external circuitry/equipment. To allow for such connections, openings are provided in the cage. These openings form an EMC path into the cage, and if not properly grounded, form a conduit or "situs" for ESD.

One approach for reducing EMC and ESD through a shielded cage opening while shielding against dust is to plug the opening with a shielded plug. For example, one shielding method mounts a shield resembling a cable connector having an electrical connector configured to operably connect with a complimentary configured card connector extending in a central aperture of the frame. This shielding plug also includes electrically conductive contact tabs adapted to electrically couple with the frame wall defining the central aperture. In order to hold the shield securely in place and thus to avoid the inconsistent shielding caused by shield movement, central aperture type shields are often adhesively mounted or mounted mechanically via screws or the like. Shield mounting thereby becomes time consuming, slows equipment assembly and teardown, and is unacceptable for many applications. Furthermore, the contact tabs are not suitable for repeated teardown and assembly.

In addition, there is an ever increasing demand for reducing the physical size and manufacturing cost of such shielding plugs. Such a grounding means is commonly assembled using a diecast shielded connector plug with a cable opening of the card connector plug being plugged since the cable is absent. Accordingly the assembly and manufacturing costs can be high using a shielded connector that resembles the original card connector but for the absence of a cable extending therefrom.

Accordingly, a need exists for a method and apparatus for shielding cage openings when they are not in use. The shield must be mechanically stable to ensure a continuous grounding, shielding, and dust protection and must be designed to facilitate assembly and teardown. In addition, it is desired that the assembly and manufacturing costs for a method and apparatus for shielding cage openings be reduced.

SUMMARY OF INVENTION

The foregoing discussed drawbacks and deficiencies of the prior art are overcome or alleviated by a method and system for a snap-fit shield which fits securely within a frame opening, and which shields and grounds the opening while eliminating a need for a complementary connector portion. The shield has an insulative inner housing having a first base wall and a first pair of side walls and end walls extending therefrom defining a first cavity. The shield includes a conductive shell having a second base wall and a second pair of side walls and end walls extending therefrom defining a second cavity. The second pair of side walls and end walls have at least one outward bias positioned thereon. The shield also has an insulative outer housing having a third base wall and a third pair of side walls and end walls extending therefrom defining a third cavity. The outer housing is configured to snap-fit within an opening in a frame so as to shield circuitry internal thereto. The third cavity of the outer housing is configured to receive at least a portion of the conductive shield therein, while the second cavity of the conductive shield is configured to receive the inner housing therein.

An exemplary embodiment of the invention also includes an electrical machine including a frame having an opening and a shield snap-fit within the frame opening so as to shield circuitry internal thereto. The shield includes an insulative inner housing having a first base wall and a first pair of side walls and end walls extending therefrom defining a first cavity. The shield has a conductive shell having a second base wall and a second pair of side walls and end walls extending therefrom defining a second cavity, the second pair of side walls and end walls have at least one outward bias positioned thereon. The shield also has an insulative outer housing having a third base wall and a third pair of side walls and end walls extending therefrom defining a third cavity. The outer housing is configured to snap-fit within an opening in a frame so as to shield circuitry internal thereto. The third cavity of the outer housing is configured to receive at least a portion of the conductive shield therein, while the second cavity of the conductive shield is configured to receive the inner housing therein. The first cavity covers an unused connector port and eliminates a complementary mating terminal connector portion in the shield.

The method includes providing electromagnetic shielding for an exposed unused connector port in electrical equipment, the frame having an opening approximately aligned with an exposed unused connector terminal. In particular, the method includes configuring an inner insulative housing having a first base wall and a first pair of side walls and end walls extending therefrom defining a first cavity. The method further includes configuring a conductive shell having a second base wall and a second pair of side walls and end walls extending therefrom defining a second cavity, the second pair of side walls and end walls having at least one outward bias positioned thereon. The method also includes configuring an insulative outer housing having a third base wall and a third pair of side walls and end walls extending therefrom defining a third cavity. The outer housing is configured to snap-fit within the opening of the frame so as to shield circuitry internal thereto. Next the inner housing is inserted into the second cavity defined by the conductive shell and at least a portion of the conductive shell having said inner housing is inserted into the third cavity defining the outer housing. The assembled shield is snap-fit in place by the action of latch features extending into the first cavity mating with corresponding latch features extending from the exposed unused connector port.

BRIEF DESCRIPTION OF DRAWINGS

Referring to the exemplary drawings wherein like elements are numbered alike in the several FIGURES.

DETAILED DESCRIPTION

Figure 1:
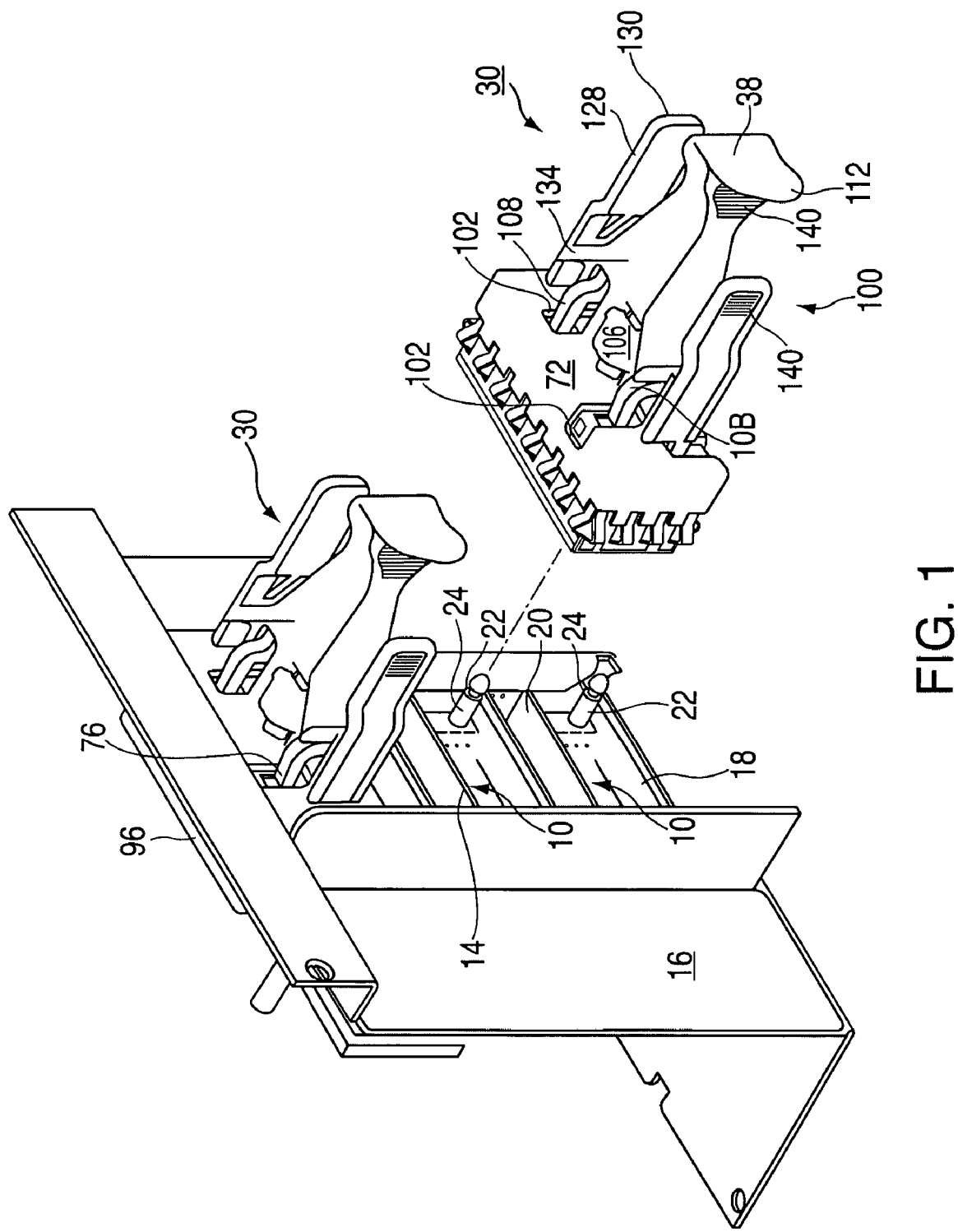
FIG. 1 is a perspective view of a plurality of electrical connectors mounted to corresponding printed circuit boards and extending through respective apertures in a panel, one shield plug is shown operably engaged with one electrical connector and a second shield plug is aligned with another electrical connector in accordance with an exemplary embodiment.

Referring to the drawings in greater detail, and first to FIG. 1, a plurality of electrical connectors, generally designated 10, are mounted to a surface of a printed circuit board (not shown), with an open front mating face 14 of the connector projecting through a respective aperture defined by a panel 16. Each connector 10 includes a rectangular box-like electrically conductive housing, generally designated 18, substantially surrounding an electrical terminal connector rectangular box-like shield, generally designated 20, except for the open front face 14 of the housing. The connector mounts a plurality of contact pins (not shown). The pin terminals are located within housing 18, and are operably connected to the printed circuit board for establishing electrical connection to appropriate circuit traces on the board. A pair of alignment pins 22 is disposed on either side of the plurality of contact pins defining a male terminal assembly. The pin terminals are adapted for mating with female terminals of a complementary connector (not shown) inserted into the open face of the connector. The complementary connector includes alignment apertures to receive alignment pins 22 and to provide proper mating alignment of mating electrical terminals. Terminal ends defining each alignment pin 22 are adapted for releasable engagement with a latch disposed with the complementary connector or a shield plug. In the embodiment shown, the terminal ends each include a detent or notch 24 adapted to releasably engage a latch of either the complementary connector or a shield plug.

The invention herein is directed to the structure and method of fabricating a shield plug 30 (FIG. 1). However, it should be understood that the particular shield plug 30 shown in FIG. 1, along with its mounting and application in an exposed terminal connector in panel 16 are for illustration purposes only. The structure and the method of fabricating the shield of the invention are applicable to a variety of other configurations of connectors than the particular system shown in FIG. 1. More specifically, a first shield plug 30 is covering a top connector 10, while a second shield plug 30 is aligned with a contiguous connector 10 to cover the same. With that understanding, reference is made to FIG. 4 wherein the final structure of shield 20 is also shown in an opposite perspective view, as depicted in conjunction with connector 10 in FIG. 1.

Figure 2:
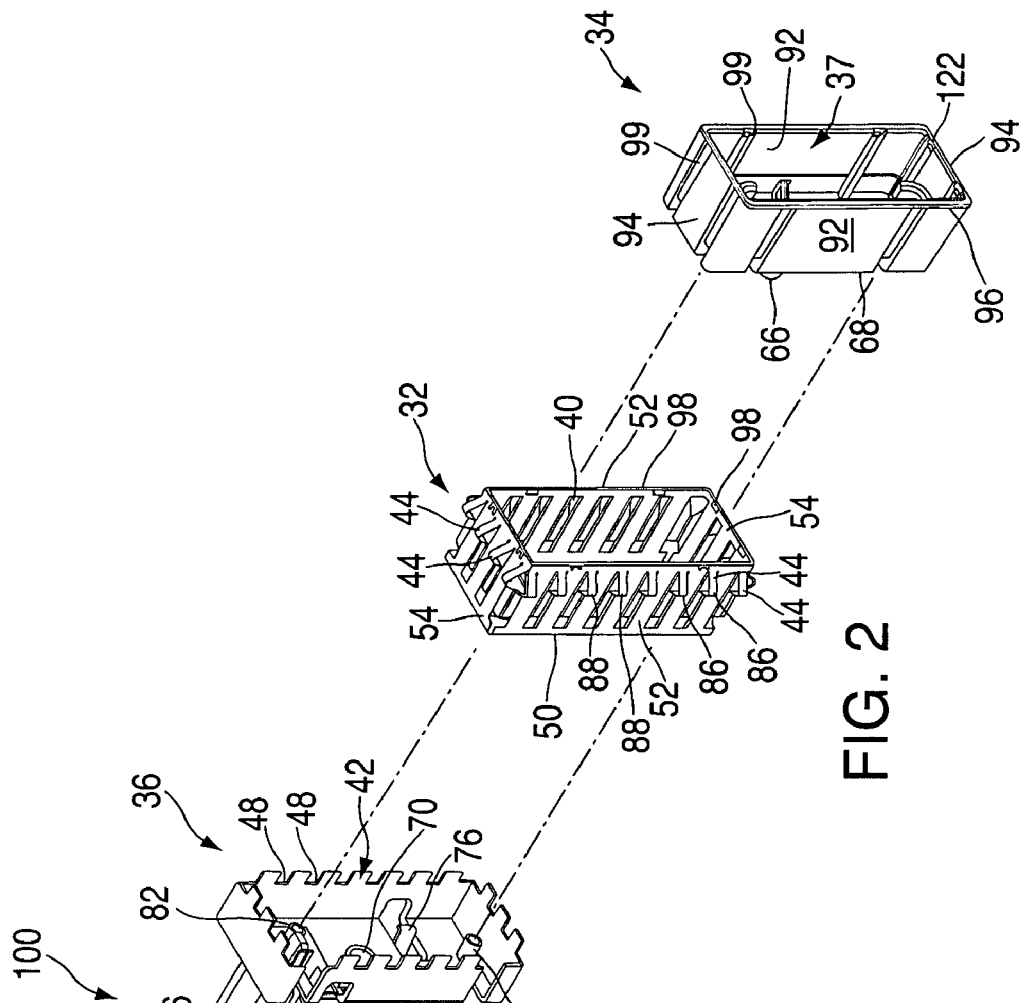
FIG. 2 is an exploded view of one of the shield plugs of FIG. 1 illustrating a handle extending from an outer housing, an EMC gasket, and an inner housing in accordance with an exemplary embodiment.

Referring now to FIG. 2, shield plug 30 is illustrated in an exploded view. Shield plug 30 includes an EMC gasket 32, an inner housing 34, and an outer housing 36. Inner housing 34 is configured as an open box structure defining a cavity 37 in which to receive alignment pins 22 and corresponding terminal connector 10 therein. Outer housing 36 includes a handle 38 extending therefrom. EMC gasket 32 is configured as a single one piece open box structure defining a cavity 40 in which to receive inner housing 34. Outer housing 36 is also configured as an open box structure defining a cavity 42. Cavity 42 is adapted to receive at least a portion of EMC gasket 32 therein leaving fingers 44 extending from a perimeter of EMC gasket 32 exposed. In this manner, EMC gasket 32 is intermediate inner housing 34 and outer housing 36. Alternatively, cutouts 48 may be configured in outer housing 36 aligned with a corresponding finger 44 allowing fingers to extend therethrough and remain exposed as illustrated in FIG. 2. In this manner, a larger portion of EMC gasket 32 may be receive within cavity 42 of outer housing 36.

Specifically, the EMC gasket 32 is stamped and formed from electrically conductive sheet metal material and includes a base wall 50 integrally joined to a pair of opposite side walls 52 and a pair of opposite end walls 54 to define a generally rectangular box-like structure having an open side defining an opening to cavity 40. The open side of the shield is coincident with the open mating face 14 of housing 18 of connector 10 as described above in relation to FIG. 1.

In this manner, connector 10 is enclosed in cavity 40. Furthermore, a complementary mating terminal is absent in exemplary embodiments compared with prior art shield plugs, therefore, reducing complexity, assembly, and cost of the shield plug.

Figure 3:
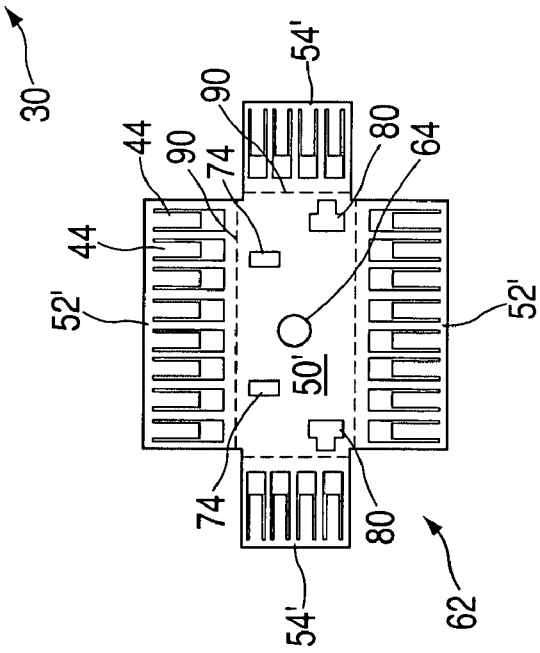
FIG. 3 is a plan view of a sheet of electrically conductive material from which the EMC gasket is fabricated in accordance with an exemplary embodiment.

Referring now to FIG. 3, EMC gasket 32 is illustrated as a planar sheet of electrically conductive material before it is formed into the open box structure illustrated in FIG. 2. A flat blank, generally designated 62, of sheet metal material is stamped from a larger piece of the material. This blank, in its entirety, is folded as shown in FIG. 3 to result in the structure of the shield shown in FIG. 2. Specifically, blank 62 includes a center section 50' which eventually forms base wall 50 of the shield; side sections 52' which eventually form side walls 52 of the shield; and end sections 54' which eventually form end walls 54 of the shield.

During the stamping of blank 62, a center hole 64 may be cut in center section 50' through which a center post 66 extending from a base wall 68 defining inner housing 34 (FIG. 2) eventually can protrude and be received in complementary aperture 70 configured in a base wall 72 defining cavity 42 of outer housing 36 (e.g., during assembly of the three pieces defining plug 30). A pair of apertures 74 are stamped or cut in blank 62 on either side of center hole 64. Apertures 74 are configured to receive snap-fit features 76 extending from outer housing 36 in cavity 42 to releasably retain outer housing 36 coupled to inner housing 34 with EMC gasket 32 therebetween. A pair of alignment pin apertures 80 are disposed outboard of apertures 74 in base wall 50'. Apertures 80 are configured to receive latch features 82 therethrough into cavity 37 for releasable latching engagement with a corresponding notch 24 (FIG. 1). Latch features 82 include inward biasing latches 82, for example, but are not limited thereto.

Figure 4:
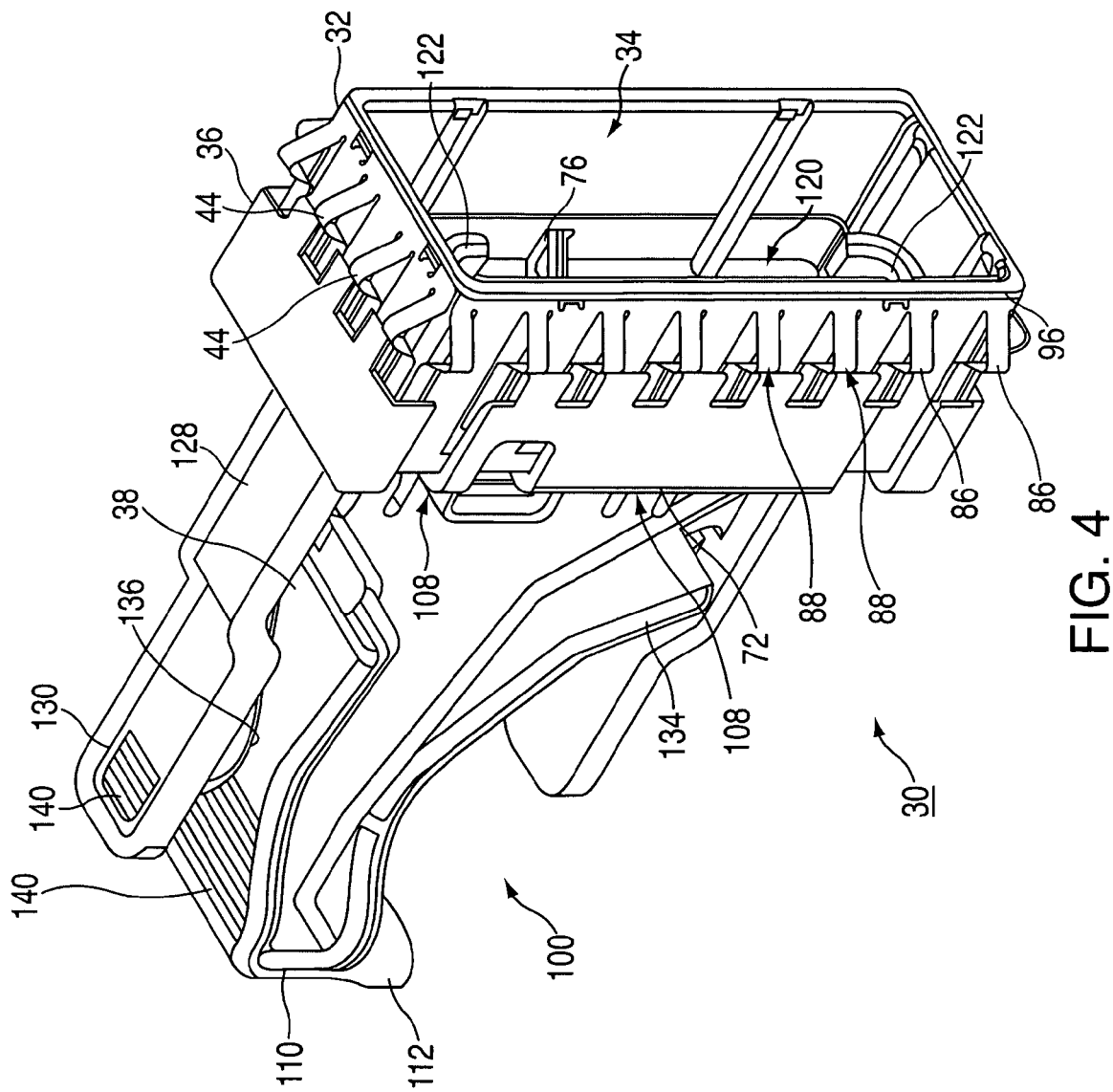
FIG. 4 is an enlarged reverse perspective view of the shield plug of FIG. 1 in accordance with an exemplary embodiment.

The plurality of fingers 44 disposed about an entire perimeter defining gasket 32 are configured in each of the side sections 52' and end sections 54'. It will be recognized by one skilled in the pertinent art that fingers 44 may also be stamped or cut into blank 62. Each finger 44 is formed by cutting three sides of a rectangle allowing retention thereof to the remaining sheet blank 62 via the uncut fourth side defining the rectangle. The resulting finger 44 is bent in a middle portion 86 defining each finger 44 to form an outward biasing member 88 as best seen in FIGS. 2 and 4.

It should be noted in FIG. 3 that a plurality of dotted lines 90 are shown between center sections 50', side sections 52', and end sections 54' in order to provide a clear and concise understanding of the portions of blank 62 which are used to eventually form the EMC gasket structure shown in FIG. 2. In essence, the dotted lines 90 represent fold lines which will be clearly understood with reference to FIGS. 2 and 3 together. Stamped blank 62 may be fed through appropriate folding or forming machines, or a single forming machine with a plurality of folding stations, to carry out the various folding operations as illustrated in FIG. 3. Upon completion of the folding operations, a simple single piece fully containable EMC spring/gasket 32 results.

Referring again to FIGS. 2 and 4, inner housing 34 and outer housing 36 are each fabricated of an insulative material such as molded plastic, for example, and accordingly dimensioned to sandwich EMC gasket 32 when the two plastic housings 34 and 36 are snapped together. In this manner, housings 34 and 36 provide damage control of EMC gasket 32, especially during shipping. More specifically, when inner housing 34 is received in cavity 40 of EMC gasket 32, side walls 92 and end walls 94 defining inner housing 34 are covered via gasket 32. Exposed terminal ends defining side walls 92 and end walls 94 each include a lip 96 adapted to receive a terminal edge 98 of corresponding gasket walls 54 and 56. In this manner, lip 96 receives a corresponding terminal edge of gasket 32 to prevent undesired folds in gasket 32 when gasket 32 and inner housing 34 are received in cavity 42 of outer housing 36. Further, inner housing walls 92 and 94 include cutouts 99 allowing inward flexing of terminal ends of fingers 44 into cavity 37.

It should be noted and will be recognized by one skilled in the pertinent art that base wall 68 defining inner housing 34 includes holes and apertures (not shown) corresponding to and aligned with hole 64, and apertures 74 and 80 on base wall 30 of gasket 32. In this manner, snap-fit/latch features 76 and 82 extending from outer housing 36 may extend into cavity 37 of inner housing 34.

Referring now to FIGS. 1, 2, and 4 a handle assembly 100 including outer housing 36 and handle 38 will now be described. Base wall 72 of outer housing 36 includes slots 102 (FIG. 1) corresponding to and aligned with hole 64, and apertures 74 and 80 on base wall 30 of gasket 32 and corresponding to apertures on base wall 68 of inner housing 34. In this manner, snap-fit/latch features 76 and 82 extending from outer housing 36 may extend into cavity 37 of inner housing 34. A cylinder portion 106 extends from base wall 72 toward handle 38 and defines complementary aperture 70 configured in base wall 72. Cylinder portion captures center post 66 extending from base wall 68 of inner housing 34, as best seen in FIG. 1 during assembly of inner and outer housings 34, 36 having EMC gasket 32 therebetween.

Handle 38 extends from base wall 72 of outer housing 36 and extends from opposite sides of cylinder portion 106. Handle 38 terminates in a handle portion 110. In an exemplary embodiment, handle portion 110 terminates with a lip portion 112 adapted for a finger to pull or push on to facilitate removal and installation of shield 30 from and to a corresponding connector 10, respectively.

Snap-fit features 76 extend from a lower portion of handle 38 proximate outer housing 36 on either side of cylinder portion 106. In an exemplary embodiment referring to FIG. 1, each snap-fit feature 76 terminates in a hook configured to releasably engage base wall 68 through apertures (not shown) therein. For example, a pair of hooks on each shield plug 30 may be oriented in opposite directions to prevent inadvertent disassembly of the plug 30 caused by shipping shock or during assembly and removal of the plug 30. In this manner, legs 108 extending to the hooks and defining snap-fit features 76 are pushed in opposite directions to release engagement of the hooks from an inside surface 120 (FIG. 4) defining base wall 68 of inner housing 34.

Latch features 82 extend into inner housing 34 via alignment pin guides 122 extending from inside surface 120 of inner housing 34. Alignment pin guides 122 are configured to facilitate alignment of a corresponding pair of alignment pins 22 upon insertion of plug 30 into a respective connector 10.

Each latch feature 82 defines one terminal end of a corresponding member 128 having an opposite terminal end 130 proximate handle portion 110. An intermediate portion 132 of member 128 attaches to an intermediate portion of handle 38 via a resilient leg 134. Each opposite terminal end 130 of each member 128 is configured to be manually biased toward handle 38 (e.g., with a finger) thereby causing latch features 82 to move away from each other. In this manner, a hook feature, for example, defining each latch feature 82 is released from a corresponding notch 24 on pins 22 to allow removal of plug 30 from connector 10. Each opposite terminal end 130 may be configured with a stop feature 136 to limit a manual bias of member 130 toward handle 38. It can be seen with reference to FIGS. 2 and 4 that stop feature 136 may be as simple as a protrusion dimensioned to limit travel of terminal end 130 toward handle 38.

Opposite terminal ends 130, including handle portion 110, optionally includes a finger grip profile to facilitate grabbing plug 30 and prevent slipping during manual manipulation of members 128 and handle portion 110. In an exemplary embodiment, the finger grip profile includes a plurality of parallel spaced apart grooves 140 for example.

Resilient legs 134 provide resiliency to allow outward movement of latch features 82, while also providing an inward bias to releasably engage corresponding notches 24 on alignment pins 22 upon insertion of a plug 30 with connector 10.

In operation, to place the inventive shield plug 30 within the frame opening 14 (FIG. 1), a user simply aligns alignment pins 22 extending therefrom with guides 122 within cavity 37 with one hand. The shield plug 30 is then inserted within the frame opening 14 until the latches features 82 engage notches 24 on respective alignment pins 22. As the shield plug 30 is inserted within frame opening 14, fingers 44 of EMC gasket 32 compress against housing 18 defining frame opening 14. The curved design defining each finger 44 to form an outward biasing member 88 and cutouts 99 in inner housing 34 facilitate their compression. Hooks defining latch features 82 then resiliently engage corresponding notches 24 and releasably lock shield plug 30 with connector 10. In this manner, fingers 44 of EMC gasket 32 surround an entire perimeter of frame opening 14 and inner housing 34 covers a male or female terminal assembly associated with connector 10. In this manner both the forward and backward movement of the shield plug 30 is limited. Accordingly the inventive shield plug 30 is securely held in place, and provides excellent shielding of an unused connector port, such as for shielding a plurality of connector pins located within a frame opening, and provides a continuous ground path between the frame 14 and the internal cage.

To remove the inventive shield plug 30 from the frame 14 opposite terminal ends 130 of members 128 are deflected inward or toward each other so that the inward biases of latch features 82 are relieved on respective notches 24. The shield 11 is then pulled from the frame opening 14. The inventive shield plug 30 is thus quickly and easily snap-fit within, and extracted from, an opening, without requiring the use of screwdrivers or other tools. The snap-fit virtually eliminates movement of the shield plug 30 once the shield plug 30 is in place within the frame opening 14, ensuring continuous grounding and shielding. Therefore with use of the inventive shield plug 30 the negative effects of EMC and ESD are significantly reduced.

Because of its simple design, the inventive shield plug 30 may be inexpensively manufactured from a single sheet of material for the EMC gasket 32 and molding inner and outer housings 34 and 36. The EMC gasket 32 is preferably made of a single one piece thin sheet, e.g., 0.005 to 0.010 inches thick, of stainless steel or beryllium copper. Other materials may be similarly employed. Fingers 44 are formed surrounding an entire perimeter of cavity 40 defined when the thin sheet is folded. Housings 34 and 36 are molded using an insulative material, and preferably molded plastic, however, other materials may be similarly employed.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the claims.

The invention claimed is:

1. An electromagnetic shield comprising:
    an insulative inner housing having a first base wall and a first pair of side walls and end walls extending from the first base wall defining a first cavity;
    a conductive shell having a second base wall and a second pair of side walls and end walls extending from the second base wall defining a second cavity, said second pair of side walls and said end walls having at least one outward bias positioned thereon; and
    an insulative outer housing having a third base wall and a third pair of side walls and end walls extending from the third base wall defining a third cavity, said outer housing being configured to snap-fit within an opening in a frame so as to shield circuitry internal thereto, wherein said third cavity of said outer housing is configured to receive at least a portion of said conductive shield therein, said second cavity of said conductive shield configured to receive said inner housing therein.

2. The shield of claim 1, wherein said conductive shell is a single one piece electrically conductive material fully contained between said inner and outer housings.

3. The shield of claim 1, wherein said outer housing includes a handle portion extending therefrom, said handle portion facilitating removal and installation of the shield to snap-fit within said opening in said frame.

4. The shield of claim 3, wherein said handle portion is configured with a latch feature to snap-fit with an alignment pin extending from said opening in said frame.

5. The shield of claim 4, wherein said latch feature includes a member defined by a hook at one end extending into said third cavity and an opposite end configured to be manually biased toward said handle to release said latch feature, said member extending from said handle portion via a resilient leg.

6. The shield of claim 5, wherein said hook releasably engages a notch on said alignment pin.

7. The shield of claim 1, wherein said at least one outward bias includes a plurality of conductive fingers configured in said pair of side walls and end walls, said plurality of conducive fingers surrounding an entire perimeter defining said second cavity.

8. The shield of claim 7, wherein said fingers provide a continuous ground path between said frame and an internal cage surrounding said circuitry.

9. The shield of claim 1, wherein said outer housing includes a snap-fit feature extending into said third cavity and into said first cavity to releasably retain said outer and inner housings together having said conductive shell therebetween.

10. The shield of claim 1, wherein said first cavity covers an unused connector port and eliminates a complementary mating terminal connector portion in the shield.

11. An electrical machine comprising:
    a frame having an opening; and
    a shield snap-fit within the frame opening so as to shield circuitry internal thereto, the shield having;
    an insulative inner housing having a first base wall and a first pair of side walls and end walls extending from the first base wall defining a first cavity;
    a conductive shell having a second base wall and a second pair of side walls and end walls extending from the second base wall defining a second cavity, said second pair of side walls and said end walls having at least one outward bias positioned thereon; and
    an insulative outer housing having a third base wall and a third pair of side walls and end walls extending from the third base wall defining a third cavity, said outer housing being configured to snap-fit within an opening in a frame so as to shield circuitry internal thereto, said third cavity of said outer housing is configured to receive at least a portion of said conductive shield therein, said second cavity of said conductive shield configured to receive said inner housing therein,
    wherein said first cavity covers an unused connector port and eliminates a complementary mating terminal connector portion in the shield.

12. The electrical machine of claim 11, further comprising:
  a computer circuit board having input/output pins in line with the frame opening; and
  a processor cage surrounding the computer circuit board and comprising an opening for exposing the pins, wherein said conductive shell of the shield provides a ground path across the frame opening.

13. The electrical machine of claim 11, wherein said conductive shell is a single one piece electrically conductive material fully contained between said inner and outer housings.

14. The electrical machine of claim 11, wherein said outer housing includes a handle portion extending therefrom, said handle portion facilitating removal and installation of the shield to snap-fit within said opening in said frame.

15. The electrical machine of claim 14, wherein said handle portion is configured with a latch feature to snap-fit with an alignment pin extending from said opening in said frame.

16. The electrical machine of claim 15, wherein said latch feature includes a member defined by a hook at one end extending into said third cavity and an opposite end configured to be manually biased toward said handle to release said latch feature, said member extending from said handle portion via a resilient leg.

17. The electrical machine of claim 16, wherein said hook releasably engages a notch on said alignment pin.

18. The electrical machine of claim 11, wherein said at least one outward bias includes a plurality of conductive fingers configured in said pair of side walls and end walls, said plurality of conducive fingers surrounding an entire perimeter defining said second cavity.

19. The electrical machine of claim 11, wherein said outer housing includes a snap-fit feature extending into said third cavity and into said first cavity to releasably retain said outer and inner housings together having said conductive shell therebetween.

20. A method for providing electromagnetic shielding for an exposed unused connector port in electrical equipment, the frame having an opening approximately aligned with an exposed unused connector terminal, the method comprising:
  configuring an inner insulative housing having a first base wall and a first pair of side walls and end walls extending from the first base wall defining a first cavity;
  configuring a conductive shell having a second base wall and a second pair of side walls and end walls extending from the second base wall defining a second cavity, said second pair of side walls and said end walls having at least one outward bias positioned thereon;
  configuring an insulative outer housing having a third base wall and a third pair of side walls and end walls extending from the third base wall defining a third cavity, said outer housing being configured to snap-fit within the opening of the frame so as to shield circuitry internal thereto,
  inserting said inner housing into said second cavity defined by said conductive shell; and
  inserting at least a portion of said conductive shell having said inner housing into said third cavity defining said outer housing;
  wherein the assembled shield is snap-fit in place by the action of latch features extending into the first cavity mating with corresponding latch features extending from the exposed unused connector port.

21. The method of claim 20, further comprising:
  configuring a handle portion to extend from said outer housing said handle portion facilitating removal and installation of the assembled shield to snap-fit within the opening in the frame.

* * * * *